(12) United States Patent
Tsai

(10) Patent No.: US 6,449,160 B1
(45) Date of Patent: Sep. 10, 2002

(54) RADIATION FIN ASSEMBLY FOR HEAT SINK OR THE LIKE

(76) Inventor: Tzu Mien Tsai, No. 6, Road 5th, Ping-Chen Industries Zone, Taoyuan Hsien (TW)

( * ) Notice: Subject to any disclaimer, the term of this patent is extended or adjusted under 35 U.S.C. 154(b) by 0 days.

(21) Appl. No.: 09/911,442

(22) Filed: Jul. 25, 2001

(51) Int. Cl.⁷ .................................................. H05K 7/20
(52) U.S. Cl. ...................... 361/709; 361/704; 361/710; 361/703; 165/80.3; 257/722; 174/16.3
(58) Field of Search ................................. 361/694, 695, 361/697, 704, 709, 710; 257/722; 174/16.3; 165/80.3, 122, 185

(56) References Cited

U.S. PATENT DOCUMENTS

| | | | |
|---|---|---|---|
| 5,558,155 A | * | 9/1996 | Ito .............................. 165/80.3 |
| 6,104,609 A | * | 8/2000 | Chen ........................... 361/695 |
| 6,269,003 B1 | * | 7/2001 | Wen-Chen ................... 361/704 |
| 6,336,498 B1 | * | 1/2002 | Wei .............................. 165/80.3 |
| 6,340,056 B1 | * | 1/2002 | Huang et al. ................ 165/185 |
| 6,382,307 B1 | * | 5/2002 | Wang et al. ................. 165/80.3 |

* cited by examiner

Primary Examiner—Doris Chervinsky
(74) Attorney, Agent, or Firm—Troxell Law Office PLLC

(57) ABSTRACT

A radiation fin assembly formed of a number of radiation fins connected in parallel, each radiation fin having a plurality of flat peripheral connecting strips, each flat connecting strip having a hook hole and an arrowhead-like hook portion; the arrowhead-like hook portions of the flat connecting strips of one radiation fin being respectively hooked in the hook holes of the flat connecting strips of another, keeping the radiation fins connected in parallel.

1 Claim, 6 Drawing Sheets

RADIATION FIN ASSEMBLY FOR HEAT SINK OR THE LIKE

BACKGROUND OF THE INVENTION

The present invention relates a radiation fin assembly for use to construct a heat sink or the like and, more particularly to such a radiation fin assembly, which is made by fastening unitary pieces of radiation fins in a stack without the use of external fastening means.

Conventional CPU heat sinks are commonly extruded from aluminum, comprising a flat base panel and a plurality of upright radiation fins integral with the top surface of the flat base panel. The dimension of an extruded aluminum heat sink is determined subject to the design of the extruding die. The aluminum extruding process is complicated, and the skill requirement is critical. Further, a CPU heat sink made of aluminum by extrusion is high.

SUMMARY OF THE INVENTION

The present invention has been accomplished under the circumstances in view. It is one object of the present invention to provide a radiation fin assembly for heat sink or the like, which is inexpensive to manufacture. It is another object of the present invention to provide a radiation fin assembly for heat sink or the like, which can be conveniently set subject to the desired dimensions. According to the present invention, radiation fins are respectively made of metal sheet material by stamping. Each radiation fin has a plurality of flat peripheral connecting strips. Each flat connecting strip has a hook hole and an arrowhead-like hook portion. The arrowhead-like hook portions of the flat connecting strips of one radiation fin are respectively hooked in the hook holes of the flat connecting strips of another, keeping the radiation fins connected in parallel. Before hooking the arrowhead-like hook portions of the flat connecting strips of a first radiation fin in the hook holes of the flat connecting strips of a second radiation fin, the flat connecting strips of the first radiation fin are bent from the horizontal position to the vertical position.

DETAILED DESCRIPTION OF THE PREFERRED EMBODIMENT

Figure 1:
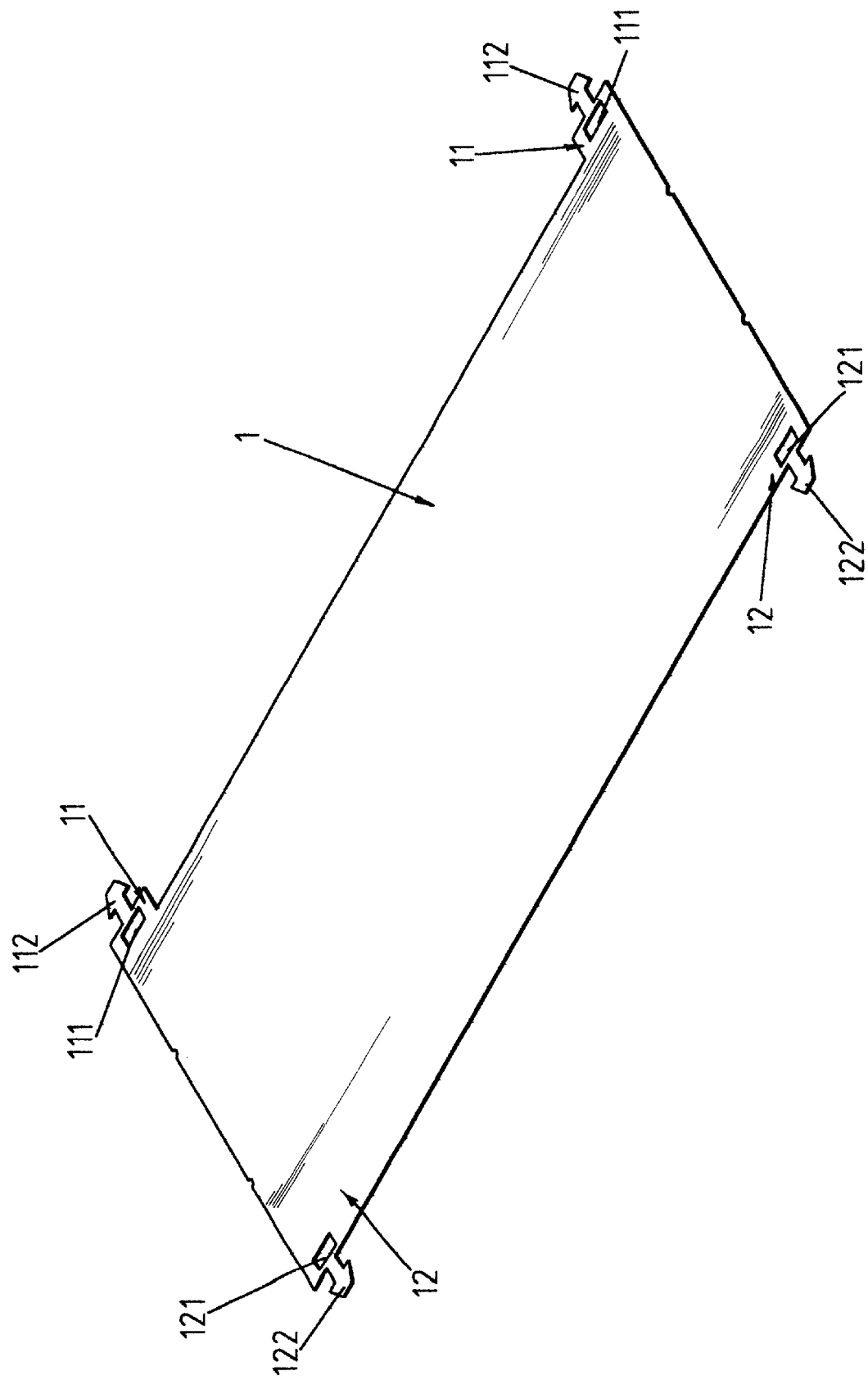
FIG. 1 illustrates the outer appearance of a radiation fin constructed according to the present invention.

Referring to FIGS. From 1 through 4, a radiation fin assembly in accordance with the present invention is generally comprised of a plurality of radiation fins 1 connected in parallel. The radiation fins 1 are flat rectangular members made of metal sheet material by stamping, each comprising a plurality of flat connecting strips 11;12 symmetrically horizontally protruded from the peripheral edge at two sides. For example, two symmetrical pairs of protruding connecting strips 11;12 are respectively extended from the two opposite long sides of the radiation fin 1 near the ends of the respective long side. The flat connecting strips 11;12 each comprise a hook hole 111 or 121, and an arrowhead-like hook portion 112 or 122.

Figure 2:
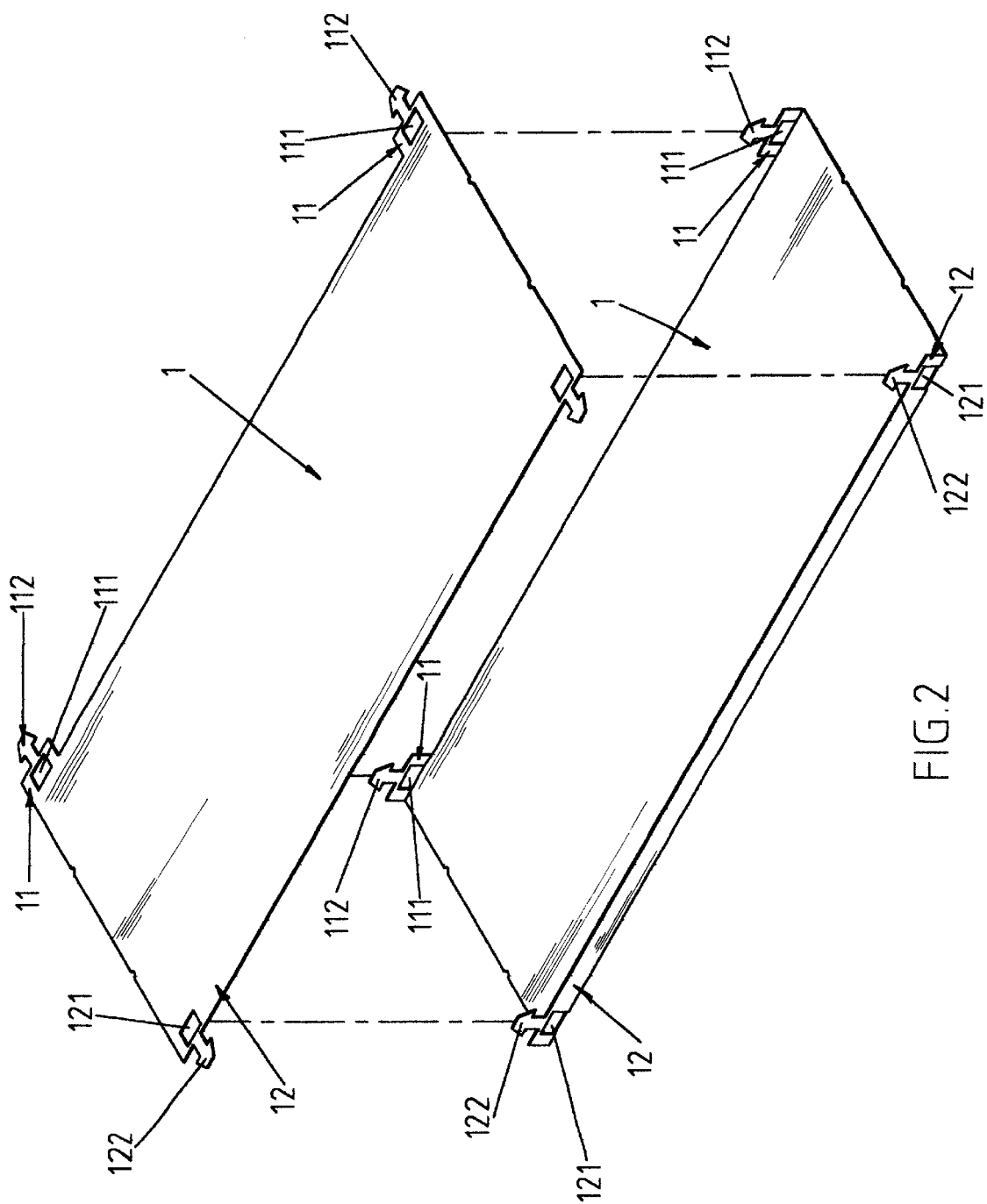
FIG. 2 illustrates the protruding connecting strips of one radiation fin bent to the vertical position for the connection of another radiation fin according to the present invention.
Figure 3:
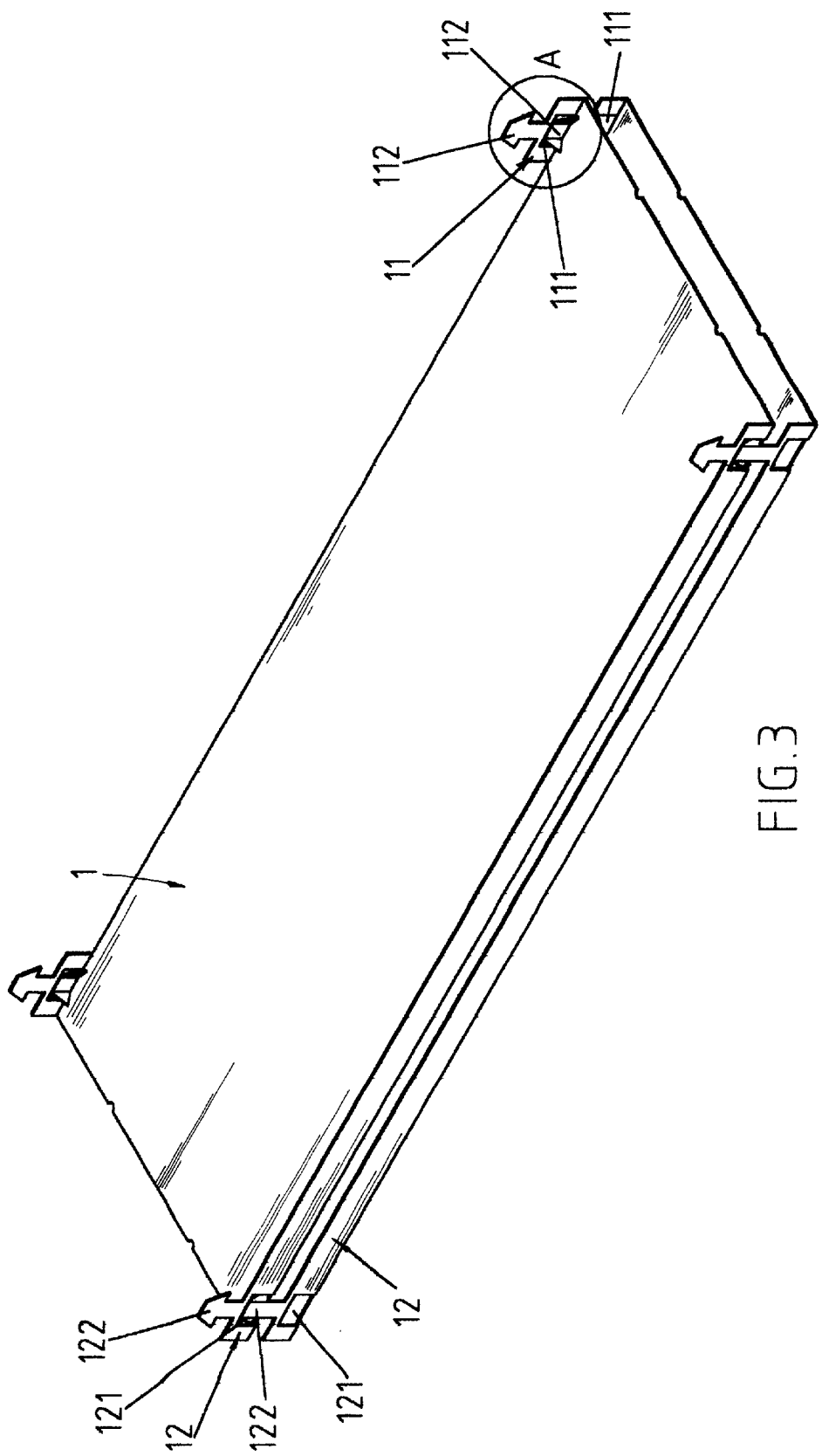
FIG. 3 shows two radiation fins fastened together.

During assembly process, as shown in FIGS. 2 and 3, the flat connecting strips 11;12 of a first radiation fin are respectively bent upwards from the horizontal position to the vertical position, and then the arrowhead-like hook portions 112;122 of the flat connecting strips 11;12 of the first radiation fin are respectively engaged into the hook holes 111;121 of the flat connecting strips 11;12 of a second radiation fin, and then the-flat connecting strips 11;12 of the second radiation fin are respectively bent upwards from the horizontal position to the vertical position, causing the arrowhead-like hook portions 112;122 of the flat connecting strips 11;12 of the first radiation fin to be firmly secured to the hook holes 111;121 of the flat connecting strips 11;12 of the second radiation fin. Repeating the aforesaid procedure, multiple radiation fins 1 are connected in a stack.

Figure 4:
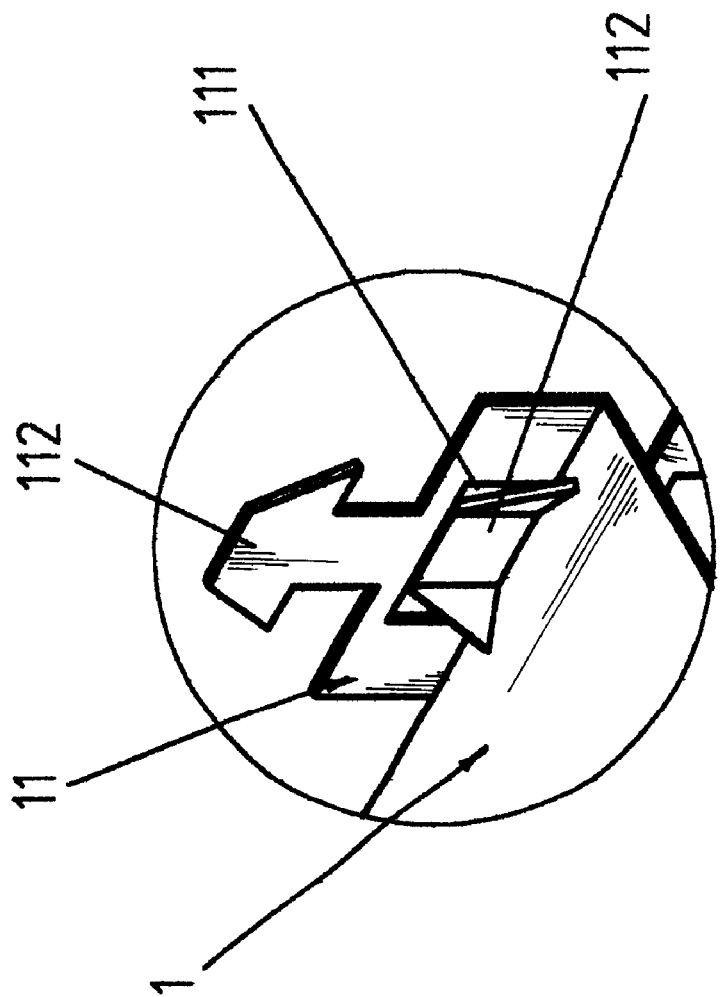
FIG. 4 is an enlarged view of part A of FIG. 3.

Referring to FIG. 4, after a predetermined number of radiation fins 1 have been connected in a stack, the stack of radiation fins 1 is fixedly fastened to the top sidewall of a flat metal panel 2, keeping the radiation fins 1 in a vertical position perpendicular to the top surface of the flat metal panel 2. Thus, the radiation fins 1 and the flat metal panel 2 form a heat sink for use to dissipate heat from a CPU. The radiating fins 1 can be fixedly fastened to the flat metal panel 2 by any of a variety of known methods, for example, by welding.

Figure 5:
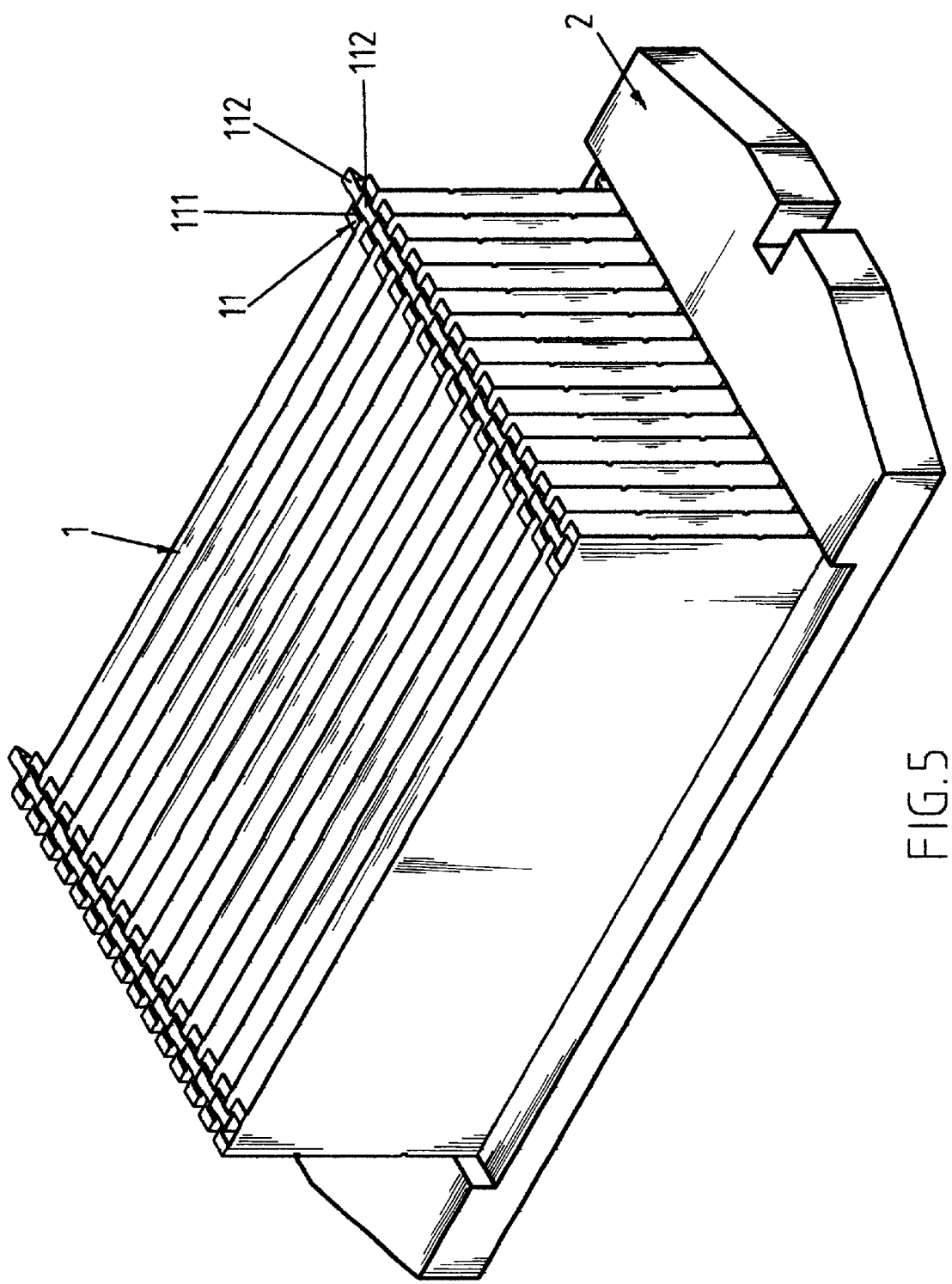
FIG. 5 illustrates one application example of the present invention.
Figure 6:
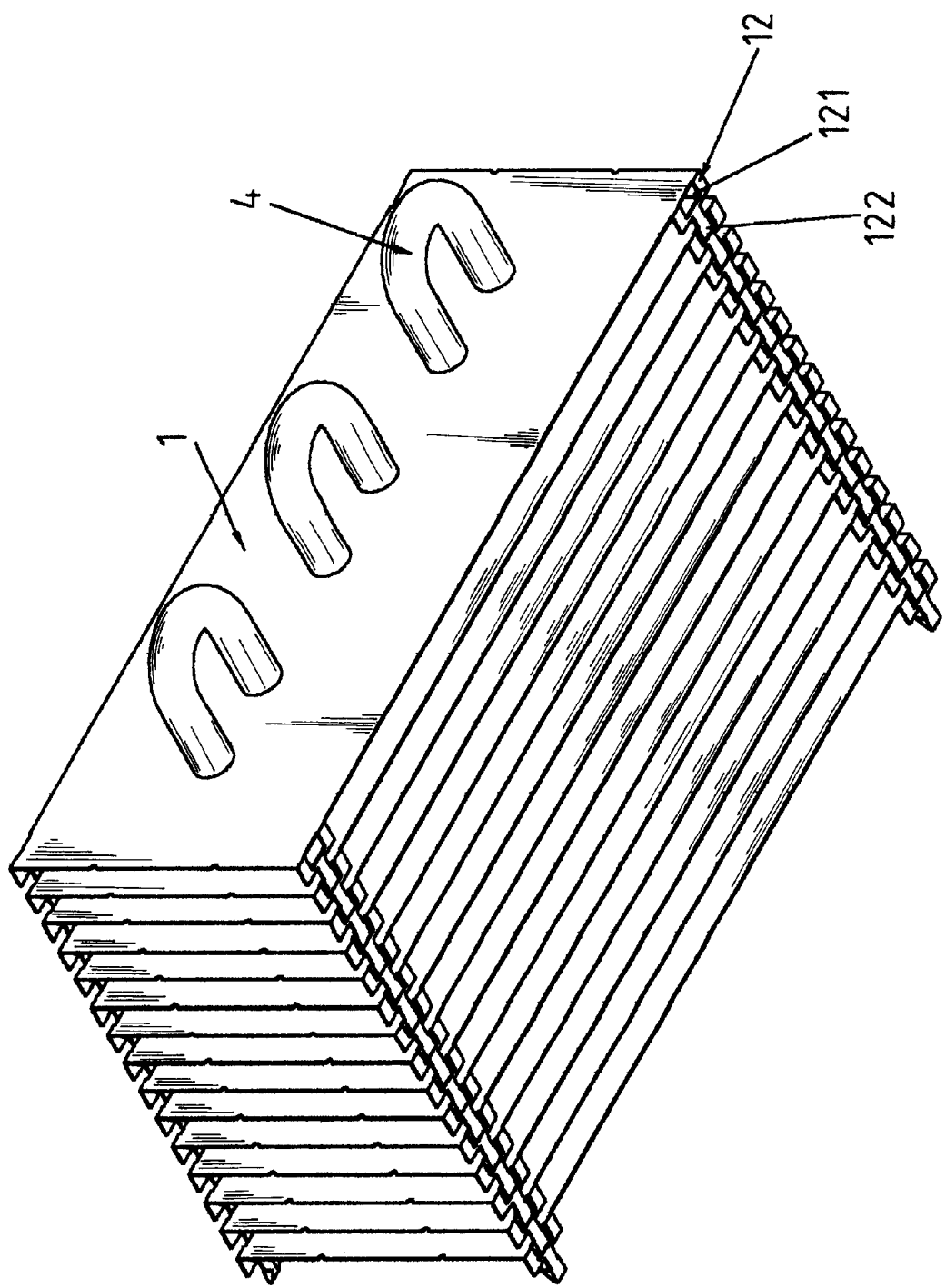
FIG. 6 illustrates another application example of the present invention.

Referring to FIG. 5, the radiation fins 1 can be mounted with a condenser coil 4 for use to construct a refrigerator or cooler. In this case, the radiation fins 1 are made having insertion holes for the passing of the condenser coil 4.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A radiation fin assembly comprising a plurality of radiation fins connected in parallel, wherein said radiation fins each comprising a plurality of flat connecting strips symmetrically protruded from the respective peripheral edge at two sides, said flat connecting strips each comprising a hook hole and an arrowhead-like hook portion; the arrowhead-like hook portions of the flat connecting strips of one of said radiation fins being respectively hooked in the hook holes of the flat connecting strips of another of said radiation fins.

* * * * *